US012300476B2

(12) United States Patent
Takebayashi et al.

(10) Patent No.: US 12,300,476 B2
(45) Date of Patent: May 13, 2025

(54) WAFER PLACEMENT TABLE (71) Applicant: NGK Insulators, Ltd., Nagoya (JP)

(72) Inventors: Hiroshi Takebayashi, Handa (JP); Mitsuru Kojima, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 202 days.

(21) Appl. No.: 18/056,333

(22) Filed: Nov. 17, 2022

(65) Prior Publication Data

US 2023/0223245 A1    Jul. 13, 2023

(30) Foreign Application Priority Data

Jan. 12, 2022    (JP) .................................. 2022-002885

(51) Int. Cl.
  *H01L 21/683*    (2006.01)
  *H01J 37/32*    (2006.01)
(52) U.S. Cl.
  CPC ...... *H01J 37/32724* (2013.01); *H01L 21/683* (2013.01); *H01L 21/6833* (2013.01); *H01J 37/32642* (2013.01); *H01J 2237/2007* (2013.01)
(58) Field of Classification Search
  CPC ................ H01J 37/32; H01J 37/32724; H01J 2237/2007; H01J 37/32532; H01J 37/32568; H01L 21/683; H01L 21/6833; H01L 21/6831; H01L 21/68757; H02N 13/00

(Continued)

(56) References Cited

U.S. PATENT DOCUMENTS 6,151,203 A * 11/2000 Shamouilian ....... H01L 21/6833
                                                361/234
8,971,008 B2 * 3/2015 Kondo ................ H01L 21/6833
                                                361/231

(Continued)

FOREIGN PATENT DOCUMENTS

EP         1 109 423 A1    6/2001
JP       2001-223248 A    8/2001

(Continued)

OTHER PUBLICATIONS

Korean Office Action (Application No. 10-2022-0155375) dated Apr. 9, 2024 (with English translation) (11 pages).

(Continued)

*Primary Examiner* — Danny Nguyen
(74) *Attorney, Agent, or Firm* — BURR PATENT LAW, PLLC (57) ABSTRACT

A wafer placement table includes a ceramic base, an electrode (FR attraction electrode), a bonding terminal (power supply terminal), and an electrode lead-out portion. The ceramic base has an upper surface serving as a wafer placement surface. The FR attraction electrode is embedded in the ceramic base. The power supply terminal is inserted into the ceramic base from a lower surface of the ceramic base and penetrates a through-hole formed in the FR attraction electrode. The electrode lead-out portion is provided at each of two or more positions at intervals along a peripheral edge of the through-hole to be thicker than the FR attraction electrode and has an inner peripheral surface bonded to a side surface of the power supply terminal.

7 Claims, 10 Drawing Sheets

(58) Field of Classification Search
USPC .......................................................... 361/234
See application file for complete search history.

(56) References Cited

U.S. PATENT DOCUMENTS

| | | | |
|---|---|---|---|
| 2007/0223167 A1* | 9/2007 | Hattori | .................. C04B 35/101 |
| | | | 361/118 |
| 2012/0250211 A1 | 10/2012 | Kida et al. | |
| 2015/0348814 A1 | 12/2015 | Shiraiwa et al. | |
| 2023/0060253 A1* | 3/2023 | Oguro | .................. H01L 21/6833 |
| 2023/0141651 A1 | 5/2023 | Kawanabe et al. | |

FOREIGN PATENT DOCUMENTS

| | | |
|---|---|---|
| JP | 2003-158051 A | 5/2003 |
| JP | 2012-216786 A | 11/2012 |
| JP | 2020-155708 A | 9/2020 |
| KR | 10 2015 0136998 A | 12/2015 |
| WO | 2021/075240 A1 | 4/2021 |

OTHER PUBLICATIONS

Japanese Office Action (with English translation) dated Aug. 20, 2024 (Application No. 2022-002885).

* cited by examiner

WAFER PLACEMENT TABLE

BACKGROUND OF THE INVENTION

1. Field of the Invention

The present invention relates to a wafer placement table.

2. Description of the Related Art

A known example of wafer placement tables includes a ceramic base with an upper surface serving as a wafer placement surface, an electrode embedded in the ceramic base, and a bonding terminal inserted into the ceramic base from a lower surface of the ceramic base and bonded to the electrode. In a wafer placement table disclosed in Patent Literature (PTL) 1, for example, an electrode lead-out portion formed integrally with the electrode and having a circular plate shape is exposed at a bottom surface of a recess that is opened at the lower surface of the ceramic base, and the electrode lead-out portion and the bonding terminal are bonded to each other with a bonding layer interposed therebetween. The bonding layer is present between the bonding terminal and a side surface of the recess as well.

CITATION LIST

Patent Literature

PTL 1: Japanese Unexamined Patent Application Publication No. 2012-216786

SUMMARY OF THE INVENTION

In the wafer placement table disclosed in PTL 1, however, particularly when the recess is shallow, sufficient bonding strength cannot be obtained between the electrode lead-out portion and the bonding terminal in some cases. On the other hand, increasing a diameter of the bonding terminal is conceivable to ensure the bonding strength, but such a solution may deteriorate heating uniformity of a wafer in some cases.

The present invention has been made to solve the above-described problems, and a main object of the present invention is to ensure the bonding strength between the electrode lead-out portion and the bonding terminal even when the bonding terminal is thin.

The present invention provides a wafer placement table including a ceramic base with an upper surface serving as a wafer placement surface, an electrode embedded in the ceramic base, a bonding terminal inserted into the ceramic base from a lower surface of the ceramic base and penetrating a through-hole formed in the electrode, and an electrode lead-out portion formed in a peripheral edge of the through-hole to be thicker than the electrode and having an inner peripheral surface bonded to a side surface of the bonding terminal.

With the wafer placement table described above, since the bonding terminal penetrates the through-hole formed in the electrode, a length by which the bonding terminal is inserted into the ceramic base is longer than that when the bonding terminal abuts against the electrode. Furthermore, since the electrode lead-out portion is formed to be thicker than the electrode, a bonding area between the side surface of the bonding terminal and the inner peripheral surface of the electrode lead-out portion is increased. As a result, bonding strength between the bonding terminal and the electrode can be ensured even when a power supply member is thin.

In this Description, words "up and down", "left and right", "front and back", etc. are used in explanation of the present invention, but "up and down", "left and right", and "front and back" merely indicate relative positional relationships. Thus, when the orientation of the wafer placement table is changed, "up and down" may be changed to "left and right", or "left and right" may be changed to "up and down" in expression of directions. Those cases also fall within the technical scope of the present invention.

In the wafer placement table according to the present invention, the electrode lead-out portion may be provided at each of two or more positions along the peripheral edge of the through-hole. With that feature, the ceramic base is less susceptible to cracking than when the electrode lead-out portion is disposed over the entire peripheral edge of the through-hole.

In the wafer placement table according to the present invention, the bonding terminal may be inserted into a terminal hole formed to penetrate the electrode from the lower surface of the ceramic base, and the electrode lead-out portion may have a shape resulting from cutting out part of a conductive material in the form of a spherical cap or a cylinder with a smaller diameter than the terminal hole by the terminal hole to be formed. With that feature, the electrode lead-out portion can be relatively easily fabricated.

In the wafer placement table according to the present invention, the bonding terminal may be brazed to a side surface of the terminal hole, the side surface including an inner peripheral surface of the through-hole and an inner peripheral surface of the electrode lead-out portion, and to a bottom surface of the terminal hole with a metallic brazing material layer interposed therebetween, and the metallic brazing material layer may be disposed not to reach the lower surface of the ceramic base. With that feature, the bonding strength is further increased.

In the wafer placement table according to the present invention, the inner peripheral surface of the electrode lead-out portion may be perpendicular to the wafer placement surface. With that feature, work of attaching the bonding terminal to the electrode lead-out portion can be more smoothly performed than when the inner peripheral surface of the electrode lead-out portion is inclined.

In the wafer placement table according to the present invention, a thickness of the electrode lead-out portion on a side close to the inner peripheral surface may be 0.1 mm or more and 1 mm or less. When the thickness is 0.1 mm or more, heat generation is sufficiently suppressed, and when it is 1 mm or less, the ceramic base is less likely to cause cracking.

In the wafer placement table according to the present invention, the electrode lead-out portion may have a downward convex shape relative to the electrode. With that feature, even when the terminal hole formed in the lower surface of the ceramic base for insertion of the bonding terminal is not deep, the electrode lead-out portion and the bonding terminal can be bonded to each other. Moreover, since the terminal hole does not need to be deep, an effect of the terminal hole on the heating uniformity can be suppressed.

DETAILED DESCRIPTION OF THE INVENTION

Figure 1:
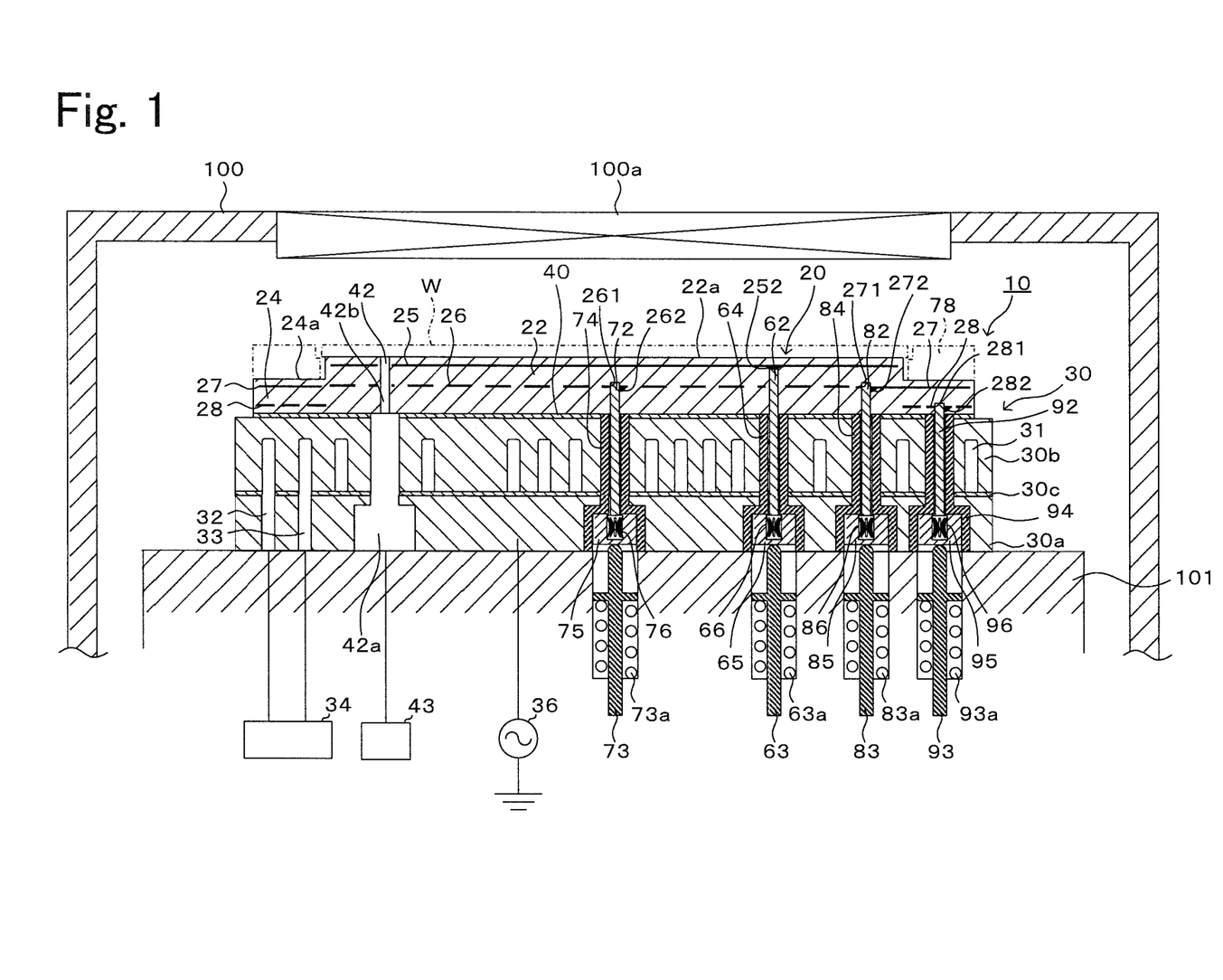
FIG. 1 is a vertical cross-sectional view of a wafer placement table 10 installed in a chamber 100.
Figure 2:
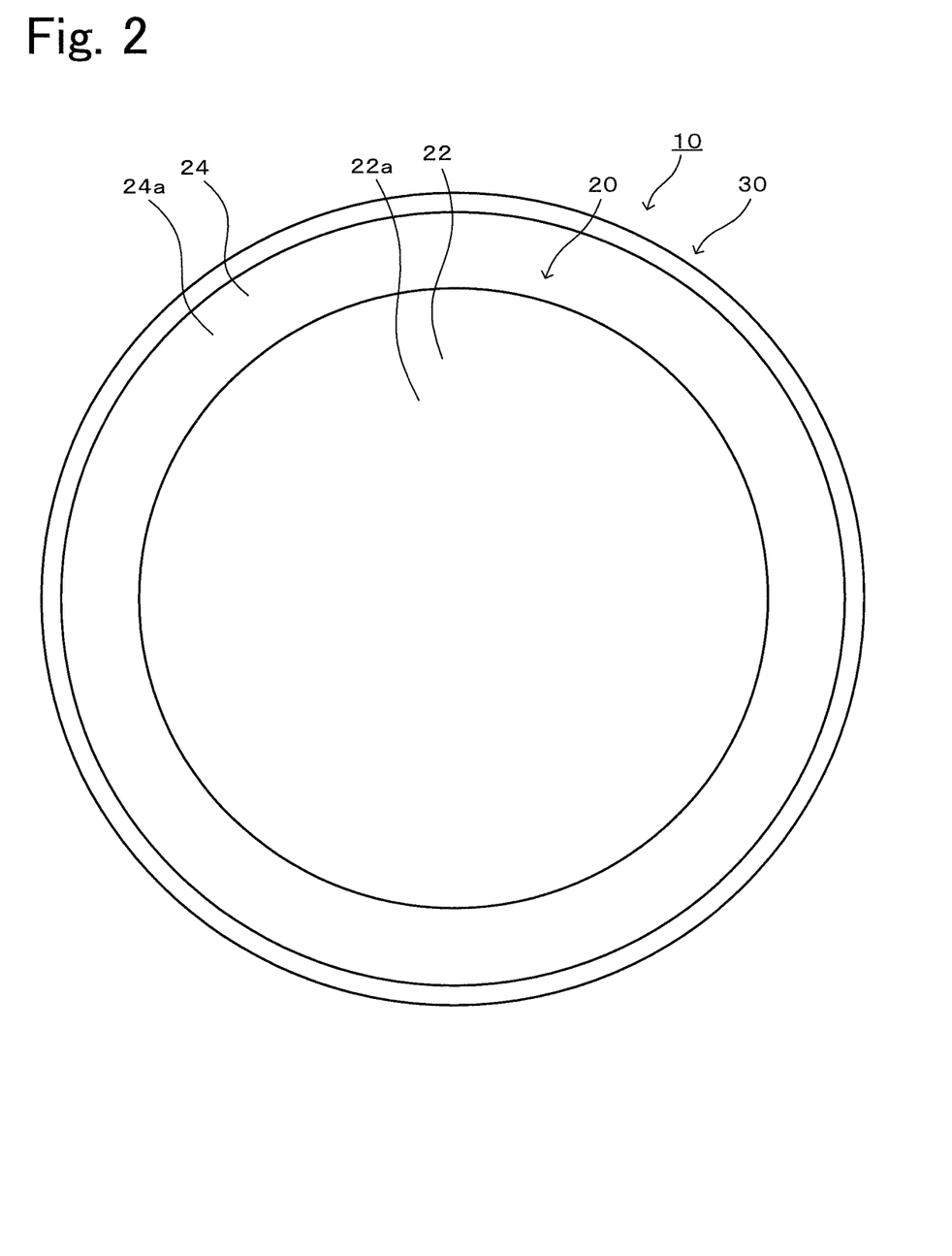
FIG. 2 is a plan view of the wafer placement table 10.
Figure 3:
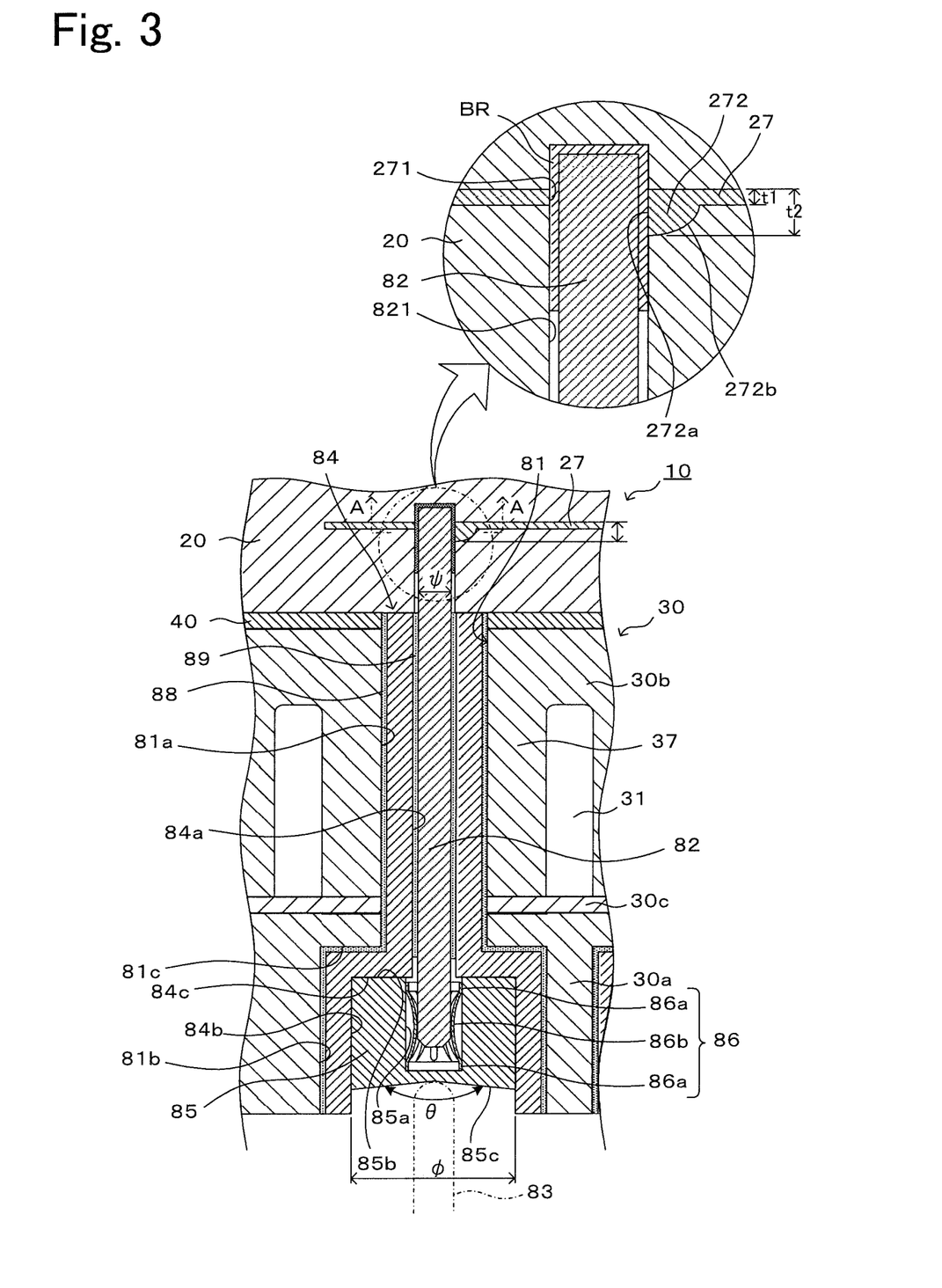
FIG. 3 is a partial enlarged view of FIG. 1.
Figure 4:
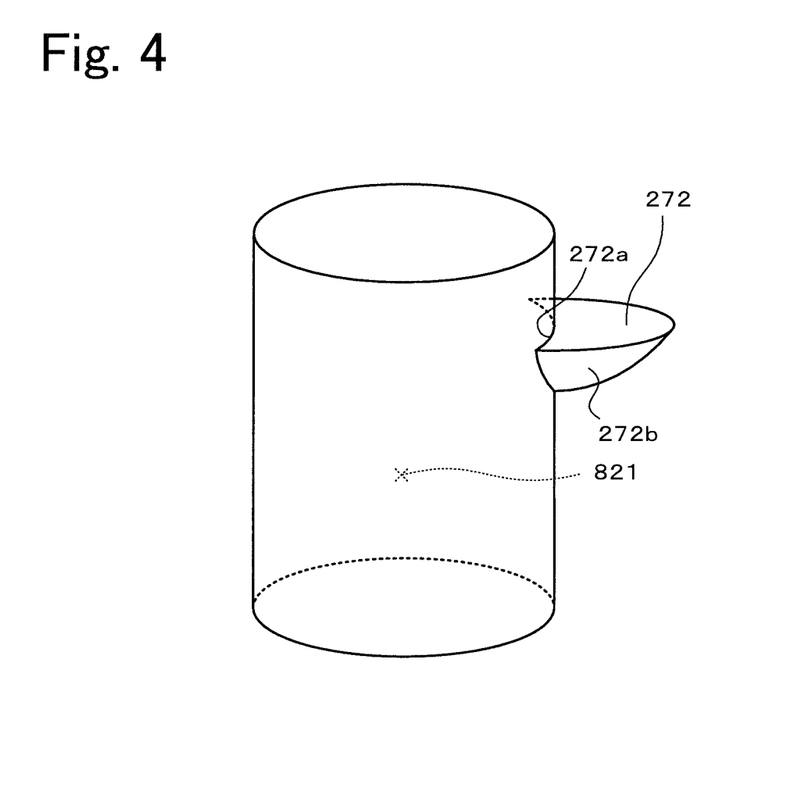
FIG. 4 is a perspective view of an electrode lead-out portion 272.
Figure 5:
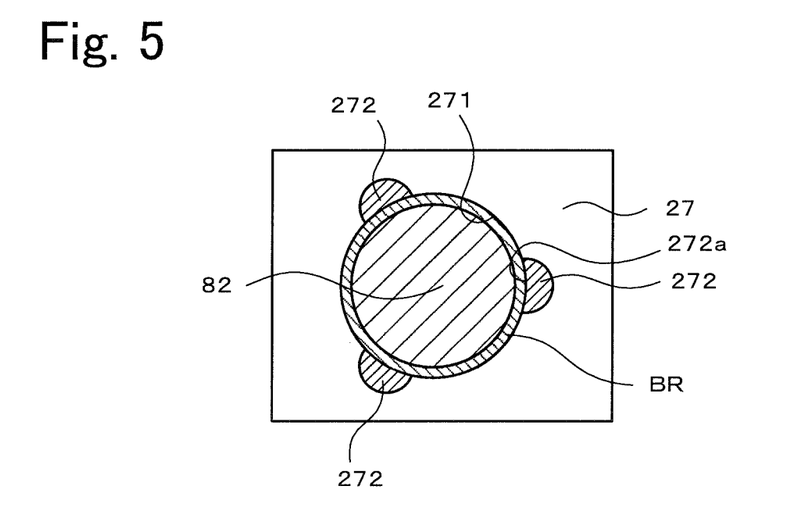
FIG. 5 is a cross-sectional view taken along A-A in FIG. 3.
Figure 6:
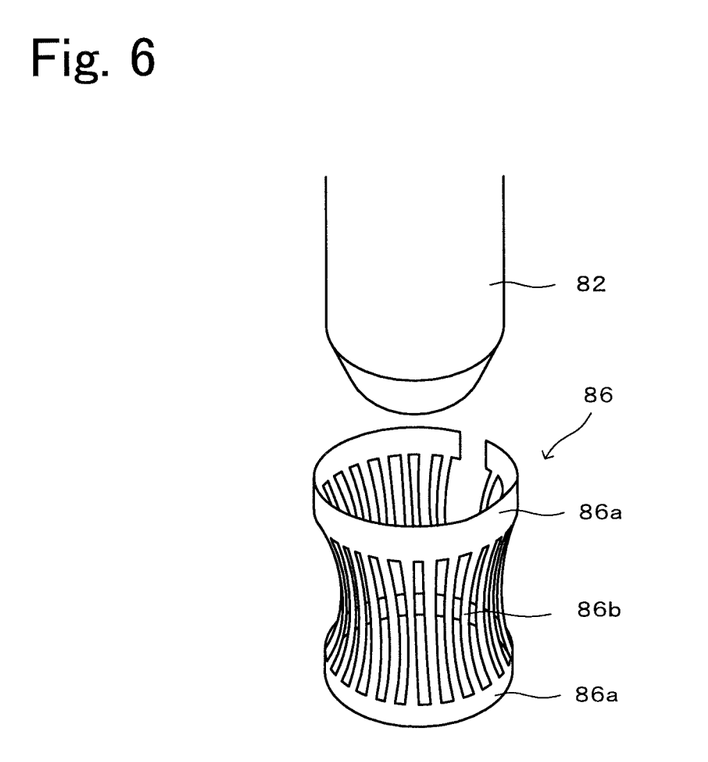
FIG. 6 is a perspective view of a louver 86.

A preferred embodiment of the present invention will be described below with reference to the drawings. FIG. 1 is a vertical cross-sectional view of a wafer placement table 10 installed in a chamber 100 (a cross-sectional view when the wafer placement table 10 is cut along a plane including a center axis of the wafer placement table 10), FIG. 2 is a plan view of the wafer placement table 10, FIG. 3 is a partial enlarged view of FIG. 1 (a cross-sectional view of a power supply terminal 82 and the surrounding thereof), FIG. 4 is a perspective view of an electrode lead-out portion 272, FIG. 5 is a cross-sectional view taken along A-A in FIG. 3, and FIG. 6 is a perspective view of a louver 86. In FIG. 4, only one of three electrode lead-out portions 272 is illustrated for convenience.

The wafer placement table 10 is used to perform CVD or etching on a wafer W with plasma and is fixed to a mounting plate 101 that is disposed inside a chamber 100 for a semiconductor process. The wafer placement table 10 includes a ceramic base 20, a cooling base 30, and a metallic bonding layer 40.

The ceramic base 20 includes an outer peripheral portion 24 with an annular focus-ring placement surface 24a around a central portion 22 with a circular wafer placement surface 22a. In the following, "focus ring" is abbreviated to "FR" in some cases. The wafer W is placed on the wafer placement surface 22a, and a focus ring 78 is placed on the FR placement surface 24a. The ceramic base 20 is made of a ceramic material represented by alumina or aluminum nitride, for example. The FR placement surface 24a is one step lower than the wafer placement surface 22a.

A wafer attraction electrode 25 and a central heater electrode 26 are built in the central region 22 of the ceramic base 20 in order from a side closer to the wafer placement surface 22a. Those electrodes 25 and 26 are made of a material containing, for example, W, Mo, Ru, WC, MoC, or the like.

The wafer attraction electrode 25 is a single-pole electrostatic electrode in the form of a circular plate or mesh. A layer forming part of the ceramic base 20 on an upper side than the wafer attraction electrode 25 functions as a dielectric layer. A thickness from an upper surface of the wafer attraction electrode 25 in the ceramic base 20 to the wafer placement surface 22a is 1 mm or less. A wafer attraction DC power supply (not illustrated) is connected to the wafer attraction electrode 25 through a power supply terminal 62 and a power supply rod 63. The power supply terminal 62 is disposed not to contact the central heater electrode 26. The power supply terminal 62 is inserted through a stepped insulating pipe 64. An upper surface of the power supply terminal 62 is bonded to a lower surface of the wafer attraction electrode 25 through an electrode lead-out portion 252 in the form of a spherical segment (form of a middle portion of a sphere when the sphere is cut along two parallel planes). The electrode lead-out portion 252 is disposed to be substantially coaxial with the power supply terminal 62 and is made of the same material as the wafer attraction electrode 25. The stepped insulating pipe 64 is inserted in a stepped hole penetrating both a cooling base 30 and a metallic bonding layer 40. A socket 65 is arranged in a diameter-increased lower pipe portion of the stepped insulating pipe 64. A lower portion of the power supply terminal 62 is inserted into a louver 66 that is arranged in a bottom-equipped hole formed in an upper surface of the socket 65, whereby the power supply terminal 62 is electrically connected to the socket 65. A lower surface of the socket 65 is in contact with an upper surface of the power supply rod 63 that is biased upward by a spring 63a.

The central heater electrode 26 is formed by wiring a resistance heating element in the form of an elongate flat plate (form of a ribbon) in a one-stroke pattern from one end to the other end to extend over the whole of the wafer placement surface 22a when viewed in plan. A central heater power supply (not illustrated) is connected to the one end of the central heater electrode 26 through both a power supply terminal 72 and a power supply rod 73. An upper portion of the power supply terminal 72 penetrates a through-hole 261 formed in a flat plate portion forming the one end of the central heater electrode 26. An electrode lead-out portion 262 is disposed in a peripheral edge of the through-hole 261 to bulge in a downward convex shape. The electrode lead-out portion 262 is made of the same material as the central heater electrode 26 and is formed to be thicker than the central heater electrode 26 in the peripheral edge of the through-hole 261. The electrode lead-out portion 262 is provided at each of two or more positions along the peripheral edge of the through-hole 261 at intervals therebetween. A side surface of an upper portion of the power supply terminal 72 is bonded to an inner peripheral surface of the through-hole 261 and an inner peripheral surface of the electrode lead-out portion 262. The power supply terminal 72 is inserted through a stepped insulating pipe 74. The stepped insulating pipe 74 is inserted in a stepped hole penetrating both the cooling base 30 and the metallic bonding layer 40. A socket 75 is arranged in a diameter-increased lower pipe portion of the stepped insulating pipe 74. A lower portion of the power supply terminal 72 is inserted into a louver 76 that is arranged in a bottom-equipped hole formed in an upper surface of the socket 75, whereby the power supply terminal 72 is electrically connected to the socket 75. A lower surface of the socket 75 is in contact with an upper surface of the power supply rod 73 that is biased upward by a spring 73a. Although not illustrated, a flat plate portion forming the other end of the central heater electrode 26 is also connected to the central heater power supply through both a power supply terminal and a power supply rod as with the flat plate portion forming the one end of the central heater electrode 26.

An FR attraction electrode 27 and an outer peripheral heater electrode 28 are built in the outer peripheral portion 24 of the ceramic base 20 in order from a side closer to the FR placement surface 24a. Those electrodes 27 and 28 are made of a material containing, for example, W, Mo, Ru, WC, MoC, or the like.

The FR attraction electrode 27 is a single-pole electrostatic electrode in the form of a circular ring-shaped plate or mesh. A layer forming part of the ceramic base 20 on an upper side than the FR attraction electrode 27 functions as a dielectric layer. An FR attraction DC power supply (not illustrated) is connected to the FR attraction electrode 27 through both a power supply terminal 82 and a power supply rod 83. An upper portion of the power supply terminal 82 penetrates a through-hole 271 formed in the FR attraction electrode 27. An electrode lead-out portion 272 is disposed in a peripheral edge of the through-hole 271 to bulge in a downward convex shape. The electrode lead-out portion 272 is made of the same material as the FR attraction electrode 27 and is formed to be thicker than the FR attraction electrode 27 in the peripheral edge of the through-hole 271. The electrode lead-out portion 272 is provided at each of two or more positions along the peripheral edge of the through-hole 271 at intervals therebetween. A side surface of an upper portion of the power supply terminal 82 is bonded to an inner peripheral surface of the through-hole 271 and an inner peripheral surface of the electrode lead-out portion 272. The power supply terminal 82 is inserted through a stepped insulating pipe 84. The stepped insulating pipe 84 is inserted in a stepped hole penetrating both the cooling base 30 and the metallic bonding layer 40. A socket 85 is arranged in a diameter-increased lower pipe portion of the stepped insulating pipe 84. A lower portion of the power supply terminal 82 is inserted into a louver 86 that is arranged in a bottom-equipped hole formed in an upper surface of the socket 85, whereby the power supply terminal 82 is electrically connected to the socket 85. A lower surface of the socket 85 is in contact with an upper surface of the power supply rod 83 that is biased upward by a spring 83a.

The outer peripheral heater electrode 28 is formed by wiring a resistance heating element in the form of an elongate flat plate (form of a ribbon) in a one-stroke pattern from one end to the other end to extend over the whole of the FR placement surface 24a when viewed in plan. An outer peripheral heater power supply (not illustrated) is connected to the one end of the outer peripheral heater electrode 28 through both a power supply terminal 92 and a power supply rod 93. An upper portion of the power supply terminal 92 penetrates a through-hole 281 formed in a flat plate portion forming the one end of the outer peripheral heater electrode 28. An electrode lead-out portion 282 is disposed in a peripheral edge of the through-hole 281 to bulge in a downward convex shape. The electrode lead-out portion 282 is made of the same material as the outer peripheral heater electrode 28 and is formed to be thicker than the outer peripheral heater electrode 28 in the peripheral edge of the through-hole 281. The electrode lead-out portion 282 is provided at each of two or more positions along the peripheral edge of the through-hole 281 at intervals therebetween. A side surface of an upper portion of the power supply terminal 92 is bonded to an inner peripheral surface of the through-hole 281 and an inner peripheral surface of the electrode lead-out portion 282. The power supply terminal 92 is inserted through a stepped insulating pipe 94. The stepped insulating pipe 94 is inserted in a stepped hole penetrating both the cooling base 30 and the metallic bonding layer 40. A socket 95 is arranged in a diameter-increased lower pipe portion of the stepped insulating pipe 94. A lower portion of the power supply terminal 92 is inserted into a louver 96 that is arranged in a bottom-equipped hole formed in an upper surface of the socket 95, whereby the power supply terminal 92 is electrically connected to the socket 95. A lower surface of the socket 95 is in contact with an upper surface of the power supply rod 93 that is biased upward by a spring 93a. Although not illustrated, a flat plate portion forming the other end of the outer peripheral heater electrode 28 is also connected to the outer peripheral heater power supply through both a power supply terminal and a power supply rod as with the flat plate portion forming the one end of the outer peripheral heater electrode 28.

The stepped insulating pipes 64, 74, 84 and 94 can be formed using a ceramic material such as alumina, for example.

The cooling base 30 is a conductive circular plate member and includes a lower member 30a and an upper member 30b bonded to each other with a conductive bonding layer 30c interposed therebetween. The conductive bonding layer 30c can be made of the same material as that of the metallic bonding layer 40 (described later). The cooling base 30 includes a coolant flow path 31 through which a coolant can circulate. The coolant flow path 31 is formed in a one-stroke pattern to extend over the whole of the ceramic base 20 from one end to the other end when viewed in plan. The coolant flow path 31 is formed by a flow channel groove formed in a lower surface of the upper member 30b and by the bonding layer 30c covering the flow path groove from below. One end of the coolant flow path 31 is in communication with a coolant supply path 32, and the other end is in communication with a coolant discharge path 33. A coolant circulator 34 is a circulation pump with a temperature adjustment function. The coolant circulator 34 introduces the coolant at a temperature adjusted to a desired value to the coolant supply path 32 and, after adjusting the temperature of the coolant discharged from the coolant discharge path 33 of the coolant flow path 31 to the desired value, introduces the discharged coolant again to the coolant supply path 32. The cooling base 30 is made of a conductive material containing a metal. The conductive material may be, for example, a composite material or a metal. The composite material may be a metal matrix composite material (also called a metal matrix composite (MMC)). The MMC may be, for example, a material containing Si, SiC and Ti, and a material made of a SiC porous body impregnated with Al and/or Si. The material containing Si, SiC and Ti is called SiSiCTi, the material made of the SiC porous body impregnated with Al is called AlSiC, and the material made of the SiC porous body impregnated with Si is called SiSiC. The metal may be, for example, Mo. The cooling base 30 is connected to a radio frequency power supply 36 for generating plasma and is used as a radio frequency electrode.

The metallic bonding layer 40 bonds a lower surface of the ceramic base 20 and an upper surface of the cooling base 30. The metallic bonding layer 40 may be a layer made of, for example, a solder or a metallic brazing material. The metallic bonding layer 40 is formed by, for example, TCB (Thermal compression bonding). The TCB indicates a known method of sandwiching a metallic bonding material between two members to be bonded, and press-bonding those two members in a state in which those members are heated to a temperature lower than or equal to the solidus temperature of the metallic bonding material.

The wafer placement table 10 includes a BS gas path 42 through which a backside gas (BS gas) is supplied to a back surface of the wafer W. The BS gas path 42 is constituted by a stepped hole 42a penetrating both the cooling base 30 and the metallic bonding layer 40 in an up-down direction, and by a through-hole 42b communicating with the stepped hole 42a and penetrating the ceramic base 20 in the up-down direction. The BS gas path 42 is connected to a BS gas supply source 43. The BS gas may be, for example, a heat conduction gas (e.g., a He gas).

Structures of the power supply terminals 62, 72, 82 and 92 of the wafer placement table 10 and their surroundings will be described below. Because the structures are common to those power supply terminals, the structure of the power supply terminal 82 and its surroundings are described with reference to FIGS. 3 to 6 in the following.

The stepped hole 81 is a hole being circular in cross-section and penetrating both the metallic bonding layer 40 and the cooling base 30 in the up-down direction. The stepped hole 81 includes an upper hole portion 81a with a small diameter, a lower hole portion 81b with a large diameter, and a hole stepped portion 81c between the upper hole portion 81a and the lower hole portion 81b. The upper hole portion 81a penetrates the metallic bonding layer 40, the upper member 30b of the cooling base 30, and the conductive bonding layer 30c and further extends up to the lower member 30a. The upper hole portion 81a passes through a region 37 of the cooling base 30 where the coolant flow path 31 is formed (namely, through a wall portion of the cooling base 30 partitioning adjacent parts of the coolant flow path 31) in the up-down direction. The lower hole portion 81b is formed to extend from an outer peripheral position of the hole stepped portion 81c to reach a lower surface of the lower member 30a. A length of the upper hole portion 81a is longer than that of the lower hole portion 81b. Thus, the coolant flow path 31 can be formed in a sufficient height (length in the up-down direction), and the heat removal performance of the coolant flow path 31 is increased.

The stepped insulating pipe 84 is inserted through the stepped hole 81 and is stuck to an inner surface of the stepped hole 81 with a silicone adhesive layer 88 interposed therebetween. An outer shape of the stepped insulating pipe 84 matches with a shape of the stepped hole 81. The stepped insulating pipe 84 includes an upper pipe portion 84a with a small diameter, a lower pipe portion 84b with a large diameter, and a pipe stepped portion 84c between the upper pipe portion 84a and the lower pipe portion 84b. The upper pipe portion 84a is positioned in the upper hole portion 81a, and the lower pipe portion 84b is positioned in the lower hole portion 81b. An outer surface of the pipe stepped portion 84c is stuck to the hole stepped portion 81c with the adhesive layer 88 interposed therebetween.

A terminal hole 821 in a bottom-equipped cylindrical shape is formed to penetrate the FR attraction electrode 27 from the lower surface of the ceramic base 20. The terminal hole 821 is substantially coaxial with an upper pipe portion 84a of the stepped insulating pipe 84.

The upper portion of the power supply terminal 82 is inserted into the terminal hole 821 and penetrated a cylindrical through-hole 271 formed in the FR attraction electrode 27. The through-hole 271 serves as part of the terminal hole 821. A plurality (here, three arranged at equal intervals as illustrated in FIG. 5) of the electrode lead-out portions 272 are formed at intervals therebetween along the peripheral edge of the through-hole 271. The electrode lead-out portion 272 has a shape resulting from cutting out part of a spherical cap (a portion of a sphere obtained by cutting the sphere along a horizontal plane) when the through-hole 821 is formed (FIG. 4). A thickness t2 of the electrode lead-out portion 272 in a cross-section cut along a vertical plane on a side close to an inner peripheral surface 272a is greater than a thickness t1 of the FR attraction electrode 27 (FIG. 3).

The thickness t2 is preferably 0.1 mm or more and 1 mm or less. The thickness t1 is preferably 0.005 mm or more and 0.03 mm or less. The thickness t2 is preferably 20 times or more than the thickness t1. A lower surface 272b of the electrode lead-out portion 272 has a downward bulged convex shape. The power supply terminal 82 is bonded to the FR attraction electrode 27 with a metallic brazing material layer BR. In more detail, the metallic brazing material layer BR is disposed in a gap between a bottom surface of the terminal hole 821 and an upper surface of the power supply terminal 82 and a gap between a side surface of the terminal hole 821 and a side surface of the power supply terminal 82. A lower end of the metallic brazing material layer BR is positioned above an opening at a lower end of the terminal hole 821 not to reach the lower surface of the ceramic base 20. An inner peripheral surface of the through-hole 271 formed in the FR attraction electrode 27 and the inner peripheral surface 272a of the electrode lead-out portion 272 are bonded to the side surface of the power supply terminal 82 with the metallic brazing material layer BR interposed therebetween. The inner peripheral surface 272a is perpendicular to the wafer placement surface 22a. The metallic brazing material layer BR is made of, for example, Au—Ge, Al, Ag, Ag—Cu—Ti, or the like. The lower portion of the power supply terminal 82 reaches the inside of the lower pipe portion 84b of the stepped insulating pipe 84.

The socket 85 is a cylindrical member made of a metal (for example, Cu) and is fitted to the lower pipe portion 84b of the stepped insulating pipe 84. The socket 85 has a bottom-equipped hole 85a formed in a central portion of its upper surface. An annular upper surface 85b of the socket 85 abuts against a pipe stepped portion 84c of the stepped insulating pipe 84. A diameter φ of a circular lower surface 85c of the socket 85 substantially matches with an inner diameter of the lower pipe portion 84b of the stepped insulating pipe 84. The lower surface 85c is a concave surface gradually recessed toward a center from an outer periphery. A taper angle θ of the concave surface is preferably greater than or equal to 90° and smaller than 180°. The louver 86 made of a metal (for example, beryllium copper) is arranged in the bottom-equipped hole 85a of the socket 85. The louver 86 includes a ring portion 86a on each of upper and lower sides and a plurality of strip members 86b vertically arranged at intervals in a circumferential direction of the ring portion 86a (see FIG. 6). The ring portion 86a is in contact with an inner peripheral wall of the bottom-equipped hole 85a of the socket 85. The ring portion 86a may have an annular shape or a C-like shape. The strip members 86b couple the upper and lower ring portions 86a to each other and have a shape curving toward a center axis of the louver 86. The lower portion of the power supply terminal 82 is inserted into the louver 86. An outer peripheral surface of the power supply terminal 82 is in contact with the strip members 86b, and a lower end surface of the power supply terminal 82 is apart from a bottom surface of the bottom-equipped hole 85a without abutting against the bottom surface. The strip members 86b are pressed by the power supply terminal 82 outward in a radial direction to come into an elastically deformed state. In other words, the louver 86 elastically supports the outer peripheral surface of the lower portion of the power supply terminal 82 in such a manner that the lower end surface of the power supply terminal 82 does not abut against the bottom surface of the bottom-equipped hole 85a of the socket 85. A relationship between the diameter ϕ of the lower surface of the socket 85 and a diameter ψ of the power supply terminal 82 preferably satisfies ψ≤ϕ/2.

An example of manufacturing the wafer placement table 10 will be described below with reference to FIGS. 7 to 9. FIGS. 7 to 9 illustrate a manufacturing process for the wafer placement table 10.

Figure 7A:
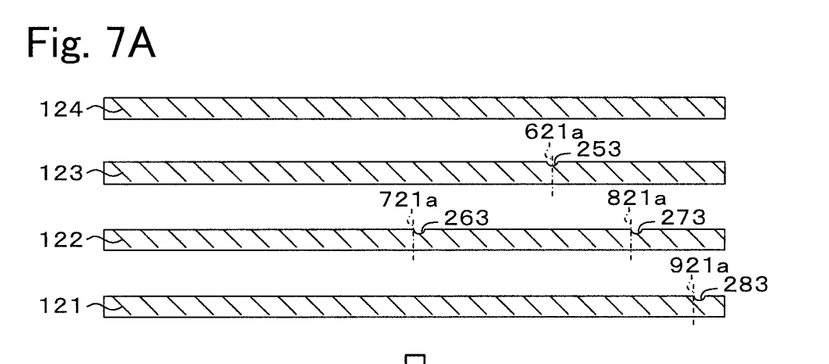
FIGS. 7A to 7D illustrate manufacturing processes for the wafer placement table 10.
Figure 8A:
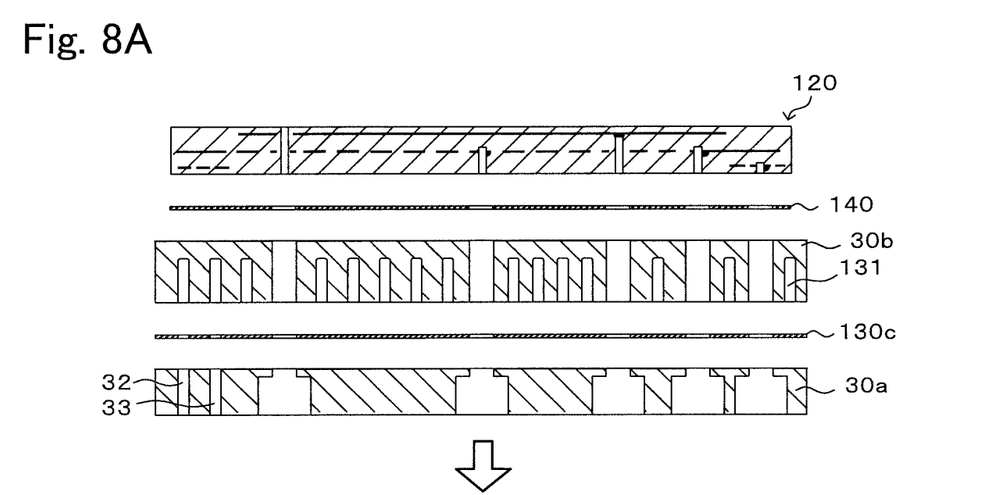
FIGS. 8A to 8C illustrate manufacturing processes for the wafer placement table 10.
Figure 8B:
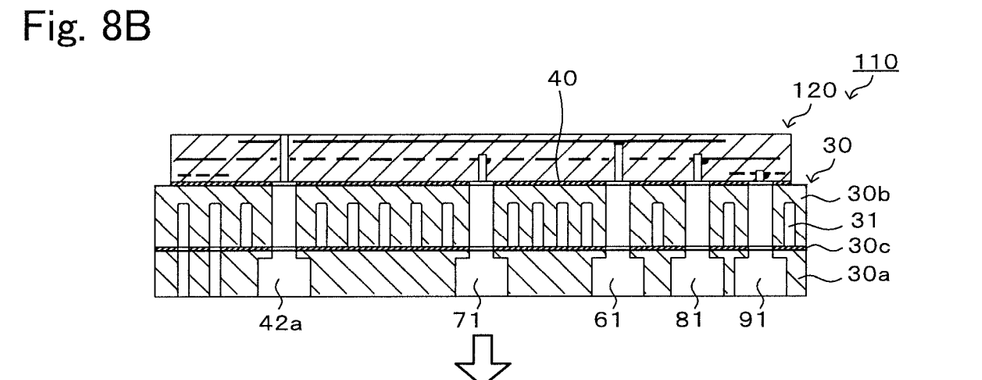
Figure 8C:
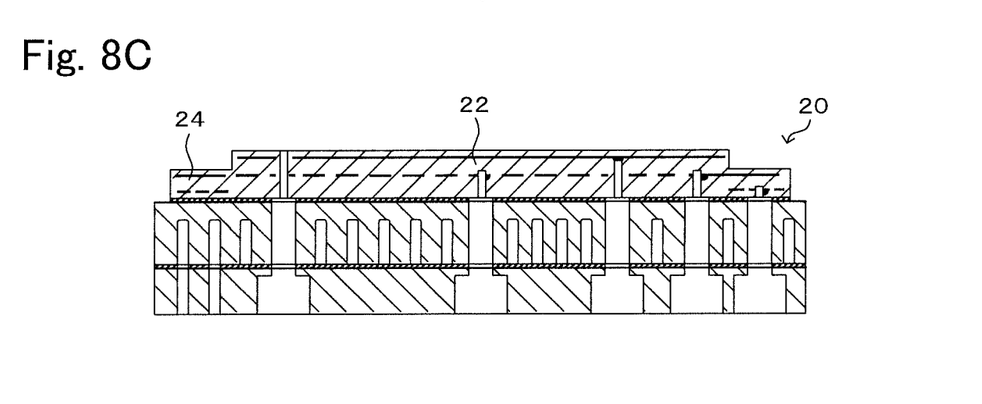

At the beginning, first to fourth ceramic molded bodies 121 to 124 in the form of a circular plate, each being a ceramic powder compact, are fabricated by a tape molding method, and holes 253, 263, 273 and 283 in the form a spherical cap are formed in upper surfaces of the first to third ceramic molded bodies 121 to 123 (FIG. 7A). In more detail, in the upper surface of the first ceramic molded body 121, the hole 283 in the form of a spherical cap is formed by cutting at a position offset from an axis 921a of a terminal hole 921 that is formed later. In the upper surface of the second ceramic molded body 122, the hole 263 in the form of a spherical cap is formed by cutting at a position offset from an axis 721a of a terminal hole 721 that is formed later, and the hole 273 in the form of a spherical cap is also formed by cutting at a position offset from an axis 821a of the terminal hole 821 that is formed later. In the upper surface of the third ceramic molded body 123, the hole 253 in the form of a spherical cap is formed by cutting such that a center of the hole 253 is aligned with an axis 621a of a terminal hole 621 formed later.

Figure 7B:
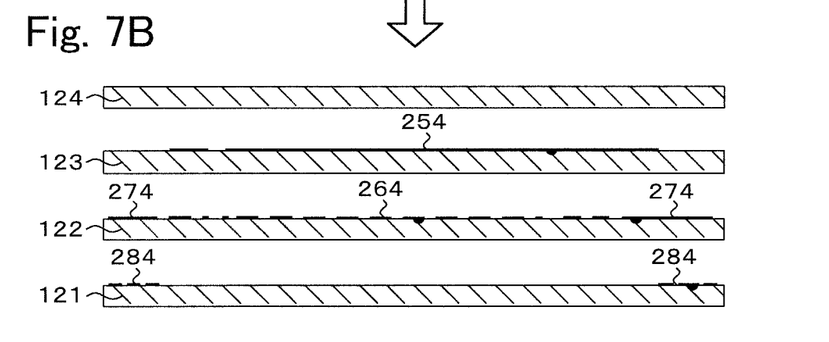

Next, a conductive paste is applied to each of the upper surfaces of the first to third ceramic molded bodies 121 to 123 in a predetermined pattern by printing (FIG. 7B). In more detail, an outer peripheral heater electrode precursor 284 finally becoming the outer peripheral heater electrode 28 is formed on the upper surface of the first ceramic molded body 121. At that time, the hole 283 is filled with the conductive paste. A central heater electrode precursor 264 finally becoming the central heater electrode 26 and an FR attraction electrode precursor 274 finally becoming the FR attraction electrode 27 are formed on the upper surface of the second ceramic molded body 122. At that time, the holes 263 and 273 are filled with the conductive paste. A wafer attraction electrode precursor 254 finally becoming the wafer attraction electrode 25 is formed on the upper surface of the third ceramic molded body 123. At that time, the hole 253 is filled with the conductive paste.

Figure 7C:
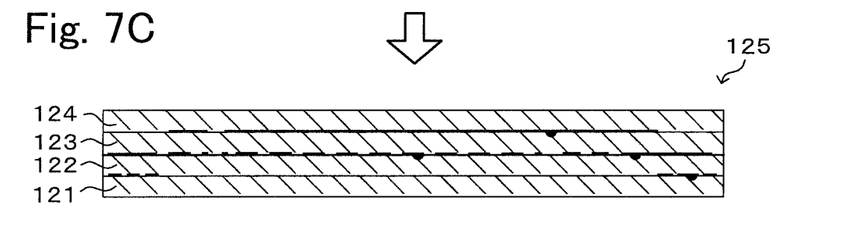
Figure 7D:
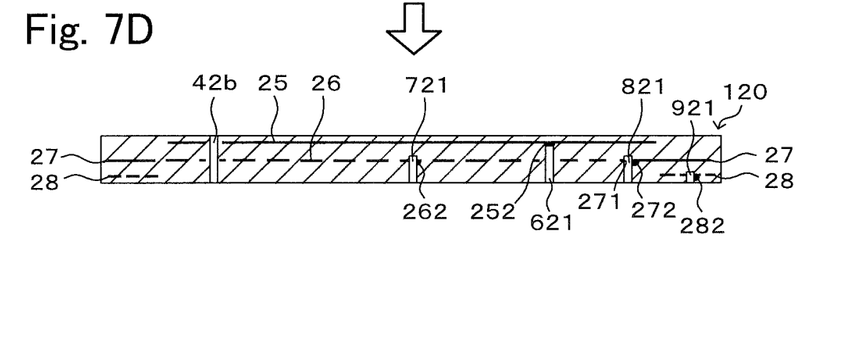

Next, the first to fourth ceramic molded bodies 121 to 124 are laminated in mentioned order from a lower side, whereby a laminate 125 is obtained (FIG. 7C). After firing the laminate 125 with a hot press, a through-hole 42b serving as part of the BS gas path 42 and the terminal holes 621, 721, 821 and 921 are formed by cutting, and a ceramic sintered body 120 in the form of a circular plate, finally becoming the ceramic base 20, is obtained through external processing and thickness processing (FIG. 7D). The electrode precursors 254, 264, 274 and 284 become respectively the electrodes 25, 26, 27 and 28 after the hot-press firing. The conductive material filled in the spherical cap-shaped hole 253 is cut out at its lower portion when the terminal hole 621 is formed, and it becomes the electrode lead-out portion 252 in the form of a spherical segment. The conductive materials filled in the spherical cap-shaped holes 263, 273 and 283 are partially cut out to become the electrode lead-out portions 262, 272 and 282 when the terminal holes 721, 821 and 921 are formed, respectively, and through-holes are formed in the electrodes 26, 27 and 28. For instance, the through-hole 271 is formed in the FR attraction electrode 27.

In parallel to the fabrication of the ceramic sintered body 120, the lower member 30a and the upper member 30b are fabricated (FIG. 8A). The coolant supply path 32, the coolant discharge path 33, and holes serving as parts of the stepped holes 42a, 61, 71, 81 and 91 are formed in the lower member 30a by cutting. A flow path groove 131 finally becoming the coolant flow path 31 and holes serving as parts of the stepped holes 42a, 61, 71, 81 and 91 are formed in the upper member 30b by cutting. When the ceramic sintered body 120 is made of alumina, the lower member 30a and the upper member 30b are preferably made of SiSiCTi or AlSiC. This is because the thermal expansion coefficient of alumina is substantially the same as that of SiSiCTi or AlSiC. When the ceramic sintered body 120 is made of AlN, the lower member 30a and the upper member 30b are preferably made of Mo. This is because the thermal expansion coefficient of AlN is substantially the same as that of Mo.

A circular plate member made of SiSiCTi can be fabricated, by way of example, as follows. First, a powder mixture is prepared by mixing silicon carbide, metal Si, and metal Ti. Next, a compact in the form of a circular plate is fabricated from the obtained power mixture by uniaxial press-molding, and the compact is sintered under an inert atmosphere with a hot press. Thus, the circular plate member made of SiSiCTi is obtained.

A metallic bonding material 130c including through-holes formed at required positions is arranged between the lower member 30a and the upper member 30b, and a metallic bonding material 140 including through-holes formed at required positions is arranged between the upper member 30b and the ceramic sintered body 120 (FIG. 8A). The above-mentioned materials and members are laminated, and a laminate is obtained.

Then, the laminate is pressed under heating (by the TCB), and a bonded body 110 is obtained (FIG. 8B). The bonded body 110 is a body in which the ceramic sintered body 120 is bonded, with interposition of the metallic bonding layer 40, to the upper surface of the cooling base 30 including the lower member 30a and the upper member 30b that are bonded to each other with the conductive bonding layer 30c interposed therebetween. An opening of the flow path groove 131 in the upper member 30b is covered with the conductive bonding layer 30c and the lower member 30a. Thus, the coolant flow path 31 is formed inside the cooling base 30. The stepped holes 42a, 61, 71, 81 and 91 are formed in the metallic bonding layer 40 and the cooling base 30.

The TCB is performed, by way of example, as follows. The laminate is pressed and bonded together at a temperature lower than or equal to the solidus temperature of the metallic bonding material (for example, a temperature higher than or equal to a value obtained by subtracting 20° C. from the solidus temperature and lower than or equal to the solidus temperature). Then, the temperature of the laminate is returned to a room temperature. As a result, the metallic bonding material becomes the metallic bonding layer. An Al—Mg bonding material or an Al—Si—Mg bonding material can be used as the metallic bonding material in the above-mentioned process. When the TCB is performed using the Al—Si—Mg bonding material, for example, the laminate is pressed in a state heated under a vacuum atmosphere. The metallic bonding material used here preferably has a thickness of about 100 μm.

Then, an outer peripheral portion of the ceramic sintered body 120 is cut to form a step, whereby the ceramic base 20 including the central portion 22 and the outer peripheral portion 24 is obtained (FIG. 8C).

Then, the wafer placement table 10 is obtained by attaching necessary members to the stepped holes 61, 71, 81 and 91. The following description is made, by way of example, in connection with the case of attaching the necessary members to the stepped hole 81. To the other stepped holes 61 and 91 as well, the necessary members are attached in a similar manner. Likewise, the necessary members are also attached to the stepped hole 71.

Figure 9A:
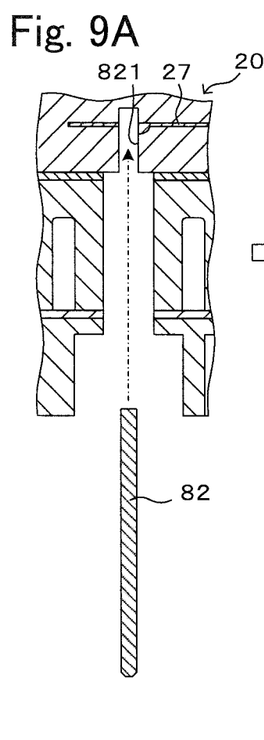
FIGS. 9A to 9D illustrate manufacturing processes for the wafer placement table 10.
Figure 9B:
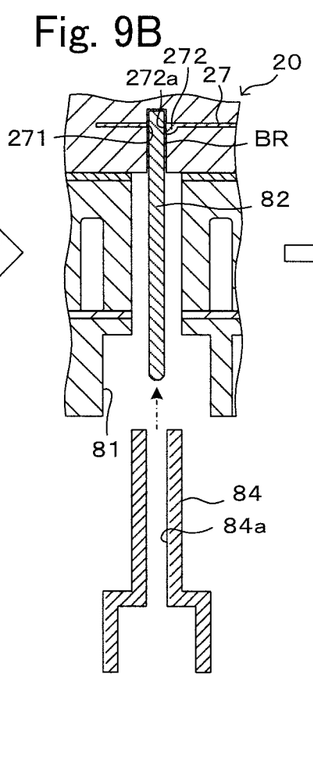

First, the power supply terminal 82 is bonded to the terminal hole 821 penetrating the FR attraction electrode 27 from the lower surface of the ceramic base 20 by using a metallic brazing material, whereby the power supply terminal 82 and the FR attraction electrode 27 are bonded to each other with the metallic brazing material layer BR interposed therebetween (FIGS. 9A and 9B). For instance, the power supply terminal 82 made of Mo is bonded to the FR attraction electrode 27 made of WC or Mo by using the metallic brazing material (for example, Au—Ge, Al, or Ag). As a result, the inner peripheral surface of the through-hole 271 formed in the FR attraction electrode 27 and the inner peripheral surface 272a of the electrode lead-out portion 272 are bonded to the side surface of the power supply terminal 82 with the metallic brazing material layer BR interposed therebetween.

Figure 9C:
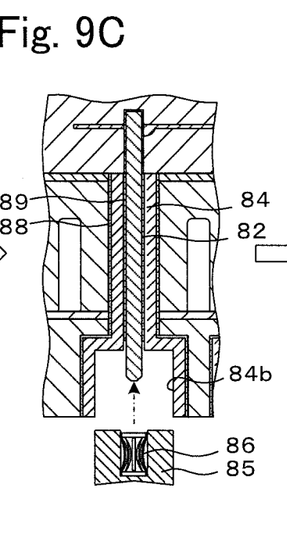

Then, a silicone adhesive is applied to the outer peripheral surface of the stepped insulating pipe 84 and the inner peripheral surface of the small-diameter upper pipe portion 84a. Thereafter, the stepped insulating pipe 84 is inserted into the stepped hole 81 while the power supply terminal 82 is inserted into the stepped insulating pipe 84. The adhesive is then solidified to form the adhesive layers 88 and 89 (FIGS. 9B and 9C). The lower end of the power supply terminal 82 comes into a state projecting into the inside of the large-diameter lower pipe portion 84b.

Figure 9D:
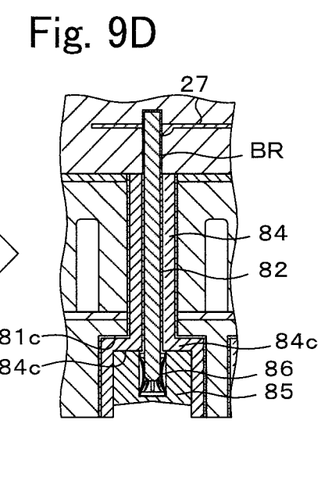

Then, the socket 85 with the louver 86 is prepared and assembled into the large-diameter lower pipe portion 84b of the stepped insulating pipe 84 of the socket 85 while the power supply terminal 82 is inserted into the louver 86 (FIGS. 9C and 9D). At that time, even if a force acting in a direction toward the FR attraction electrode 27 is applied to the socket 85, the force is exerted on the pipe stepped portion 84c and the hole stepped portion 81c because the socket 85 does not abut against the lower end surface of the power supply terminal 82. Therefore, the socket 85 does not press the power supply terminal 82. In addition, the louver 86 in the socket 85 elastically supports the outer peripheral surface of the power supply terminal 82 without abutting against the lower end surface of the power supply terminal 82. Therefore, the load generated when the power supply terminal 82 and the louver 86 in the socket 85 are connected to each other is not applied to the metallic brazing material layer BR at which the power supply terminal 82 and the FR attraction electrode 27 are bonded to each other.

The necessary members are attached to the other stepped holes 61, 71 and 91 as well in a similar manner. Thus, the wafer placement table 10 is obtained.

An example of use of the wafer placement table 10 will be described below with reference to FIG. 1. The wafer placement table 10 is set, as described above, on the mounting plate 101 in the chamber 100. A shower head 100a discharging a process gas toward the inside of the chamber 100 from many gas injection holes is arranged at a ceiling surface of the chamber 100.

The focus ring 78 is placed on the FR placement surface 24a of the wafer placement table 10, and the wafer W in the form of a disk is placed on the wafer placement surface 22a. The focus ring 78 includes a step formed along an inner periphery of its upper end portion not to interfere with the wafer W. In this state, a DC voltage is applied to the wafer attraction electrode 25 to attract the wafer W onto the wafer placement surface 22a, and a DC voltage is applied to the FR attraction electrode 27 to attract the focus ring 78 onto the FR placement surface 24a. Furthermore, the BS gas (for example, a helium gas) is supplied to the back surface of the wafer W from the BS gas path 42, and currents are supplied to the central heater electrode 26 and the outer peripheral heater electrode 28 to make control such that the wafer W is heated to a high temperature. Then, the inside of the chamber 100 is held under a predetermined vacuum atmosphere (or a reduced-pressure atmosphere), and a radio frequency voltage from the radio frequency power supply 36 is applied to the cooling base 30 while the process gas is supplied from the shower head 100a. As a result, plasma is generated between the cooling base 30 and the shower head 100a. The wafer W is processed with the generated plasma. The temperature of the wafer W is adjusted as required by circulating the coolant through the coolant flow path 31.

The correspondence between components in this embodiment and components in the present invention is clarified here. The ceramic base 20 in this embodiment corresponds to a "ceramic base" in the present invention, and the central heater electrode 26, the FR attraction electrode 27, and the outer peripheral heater electrode 28 each correspond to an "electrode". The power supply terminals 72, 82 and 92 each correspond to a "bonding terminal", and the electrode lead-out portions 272, 282 and 292 each correspond to an "electrode lead-out portion".

With the wafer placement table 10 according to this embodiment described in detail above, since the power supply terminal 82 penetrates the through-hole 271 formed in the FR attraction electrode 27, a length by which the power supply terminal 82 is inserted into the ceramic base 20 is longer than that when the power supply terminal 82 abuts against the lower surface of the FR attraction electrode 27. Furthermore, since the electrode lead-out portion 272 is formed to be thicker than the FR attraction electrode 27, a bonding area between the side surface of the power supply terminal 82 and the inner peripheral surface 272a of the electrode lead-out portion 272 is increased. As a result, bonding strength between the power supply terminal 82 and the FR attraction electrode 27 can be ensured even when the power supply terminal 82 is thin. Moreover, since the three electrode lead-out portions 272 are disposed along the peripheral edge of the through-hole 271, the ceramic base 20 is less susceptible to cracking than when the electrode lead-out portion 272 is disposed over the entire peripheral edge of the through-hole 271. The above-mentioned points are similarly applied to the power supply terminals 72 and 92 and the electrode lead-out portions 262 and 282.

The three electrode lead-out portions 272 are disposed at equal intervals along the peripheral edge of the through-hole 271. Thus, since the electrode lead-out portions 272 are disposed in a distributed fashion at equal intervals instead of being disposed over the entire peripheral edge of the through-hole 271, cracking of the ceramic base 20 can be more reliably suppressed with ease. The above-mentioned point is similarly applied to the electrode lead-out portions 262 and 282.

Since the electrode lead-out portion 272 has the shape resulting from cutting out part of the conductive material in the form of a spherical cap with a smaller diameter than the terminal hole 821 including the through-hole 271 by the terminal hole 821 to be formed (FIG. 4), the electrode lead-out portion 272 can be relatively easily fabricated (FIGS. 7C and 7D). The above-mentioned point is similarly applied to the electrode lead-out portions 262 and 282.

The power supply terminal 82 is brazed to part of the side surface of the terminal hole 821 and to the bottom surface thereof. Accordingly, the bonding strength is further increased. The above-mentioned point is similarly applied to the power supply terminals 72 and 92.

Since the inner peripheral surface 272a of the electrode lead-out portion 272 is perpendicular to the wafer placement surface 22a, work of attaching the power supply terminal 82 to the electrode lead-out portion 272 can be more smoothly performed than when the inner peripheral surface 272a of the electrode lead-out portion 272 is inclined. The above-mentioned point is similarly applied to the electrode lead-out portions 262 and 282.

Because the distance between the upper surface of the wafer attraction electrode 25 in the ceramic base 20 and the wafer placement surface 22a is as small as 1 mm or less, the dielectric layer cannot be secured if the power supply terminal 62 is disposed in a fashion of penetrating the wafer attraction electrode 25. In consideration of that point, a through-hole penetrating the power supply terminal 62 is not formed in the wafer attraction electrode 25, and the upper surface of the power supply terminal 62 is brazed to the electrode lead-out portion 252 disposed at the lower surface of the wafer attraction electrode 25.

In addition, the thickness t2 of the electrode lead-out portion 272 on the side close to the inner peripheral surface 272a is preferably 0.1 mm or more and 1 mm or less. When the thickness t2 is 0.1 mm or more, heat generation is sufficiently suppressed, and when it is 1 mm or less, the ceramic base 20 is less likely to cause cracking. The above-mentioned point is similarly applied to the electrode lead-out portions 262 and 282.

The electrode lead-out portion 272 has the downward convex shape relative to the FR attraction electrode 27. Accordingly, even when the terminal hole 821 is not deep, the electrode lead-out portion 272 and the power supply terminal 82 can be bonded to each other. Moreover, since the terminal hole 821 does not need to be deep, an effect of the terminal hole 821 on the heating uniformity can be suppressed. The above-mentioned point is similarly applied to the electrode lead-out portions 262 and 282.

It is needless to say that the present invention is not limited to the above-described embodiment, and that the present invention can be implemented in various modified forms as long as falling within the technical scope of the present invention.

Figure 10:
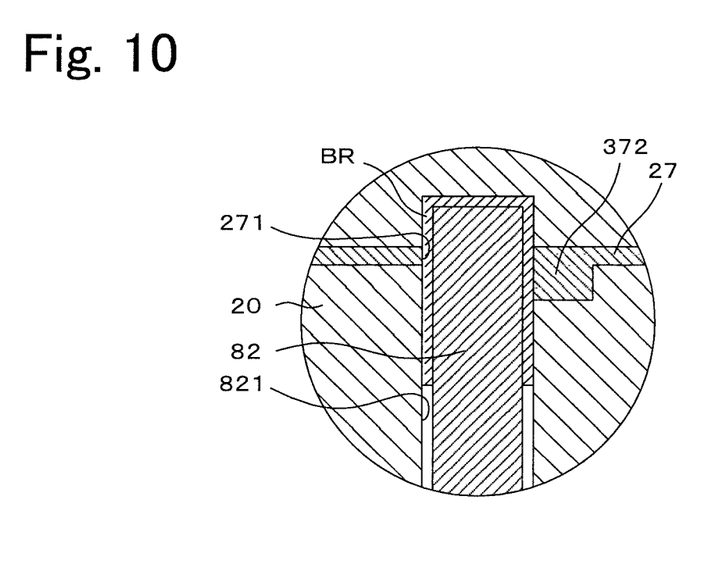
FIG. 10 is a partial enlarged view of an electrode lead-out portion 372 and the surrounding thereof.
Figure 11:
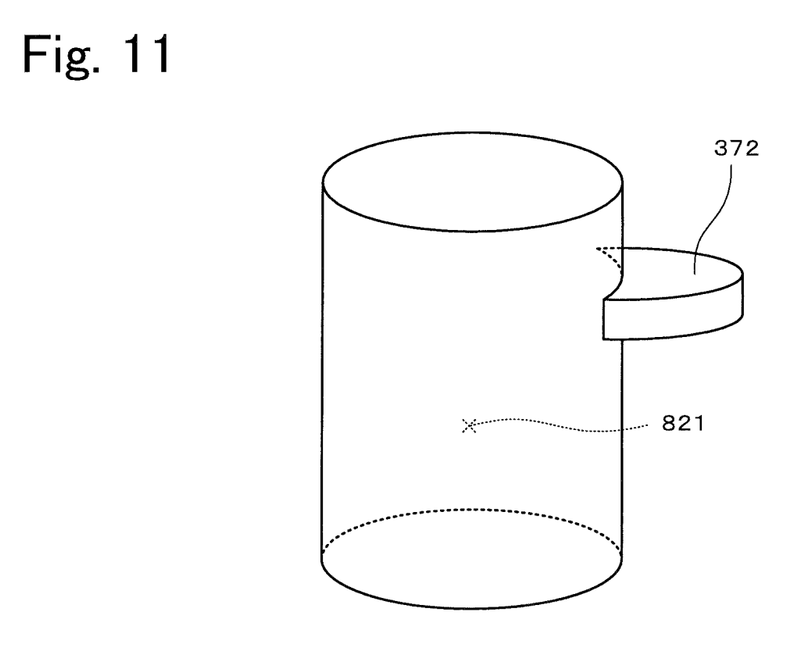
FIG. 11 is a perspective view of the electrode lead-out portion 372.

While, in the above-described embodiment, the electrode lead-out portion 272 has the shape resulting from cutting out part of the conductive material in the form of a spherical cap with the smaller diameter than the terminal hole 821 by the terminal hole 821 to be formed, the present invention is not particularly limited to that example. In another example, like an electrode lead-out portion 372 illustrated in FIGS. 10 and 11, the electrode lead-out portion may have a shape resulting from cutting out part of the conductive material in the form of a cylinder with a smaller diameter than the terminal hole 821 by the terminal hole 821 to be formed. Note that, in FIGS. 10 and 11, the same components as those in the above-described embodiment are denoted by the same reference signs.

While the above-described embodiment represents the example in which the wafer attraction electrode 25, the central heater electrode 26, the FR attraction electrode 27, and the outer peripheral heater electrode 28 are built in the ceramic base 20, there is no specific reason to limit the present invention to that example. At least one of the above-mentioned electrodes may be built in the ceramic base 20. Moreover, an RF electrode may be built in the ceramic base 20. In that case, structures of a power supply terminal, a power supply rod, and so on connected to the RF electrode may be formed as with the structures illustrated in FIG. 3.

While, in the above-described embodiment, the three electrode lead-out portions 272 are disposed along the peripheral edge of the through-hole 271 as illustrated in FIG. 5, the number of the electrode lead-out portions 272 is not particularly limited to three and may be two or four more. While the electrode lead-out portions 272 are disposed along the peripheral edge of the through-hole 271 at equal intervals, they may be disposed at unequal intervals. As an alternative, the electrode lead-out portion 272 may be disposed over the entire periphery of the through-hole 271. The above-mentioned points are similarly applied to the electrode lead-out portions 262 and 282.

While, in the above-described embodiment, an example of arranging the socket 85 with the louver 86 in the lower pipe portion 84b of the stepped insulating pipe 84 inserted into the stepped hole 81 has been described as a configuration for connecting the power supply terminal 82 to the heater power supply (not illustrated), the present invention is not particularly limited to that example. In another example, the configuration may be modified such that the stepped hole 81 is replaced with a straight hole, the stepped insulating pipe 84 is replaced with a straight insulating pipe, and that the lower end of the power supply terminal 82 reaches the lower surface of the cooling base 30 without using the socket 85.

While, in the above-described embodiment, the first to fourth ceramic molded bodies 121 to 124 are fabricated by the tape molding method, the present invention is not particularly limited to that case. In another example, those ceramic molded bodies may be fabricated by, for example, a mold casting method or a method of press-compacting ceramic powder.

The wafer placement table 10 according to the above-described embodiment may have a lift pin hole through which a lift pin (not illustrated) for moving the wafer W up and down relative to the wafer placement surface 22a is inserted. The lift pin hole penetrates the wafer placement table 10 in an up-down direction.

While, in the above-described embodiment, the ceramic base 20 and the cooling base 30 are bonded to each other with the metallic bonding layer 40 interposed therebetween, a resin bonding layer may be used instead of the metallic bonding layer 40. In that case, the upper pipe portions of the stepped insulating pipes 64, 74, 84 and 94 may or may not be inserted into holes in the resin bonding layer. In consideration of thermal conductivity, however, using the metallic bonding layer 40 is more desirable than using the resin bonding layer.

While the above-described embodiment has been described in connection with an example in which the power supply terminals 62, 72, 82 and 92 are insulated from the cooling base 30, at least one of the power supply terminals 62, 72, 82 and 92 may be connected to the cooling base 30 in some cases to be held at the same potential as the cooling base 30 such that the wafer placement table is grounded as a whole through the cooling base 30.

Figure 12:
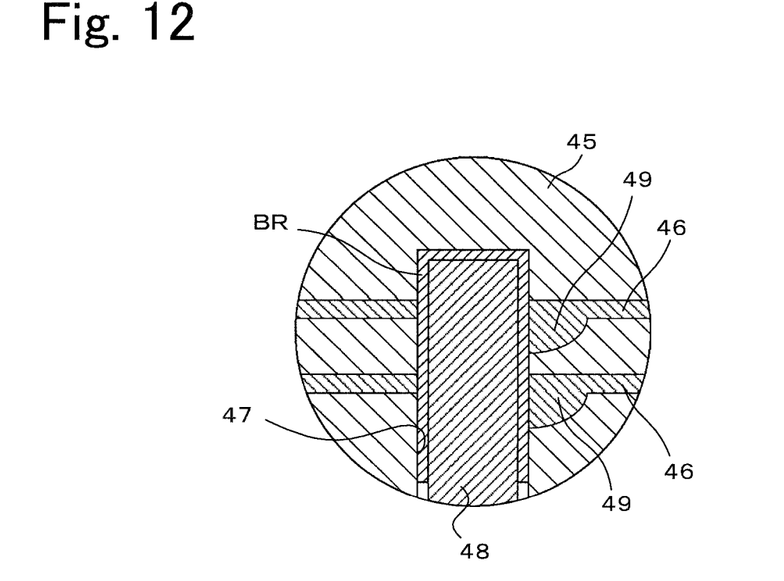
FIG. 12 is a partial vertical cross-sectional view of another embodiment.
Figure 13:
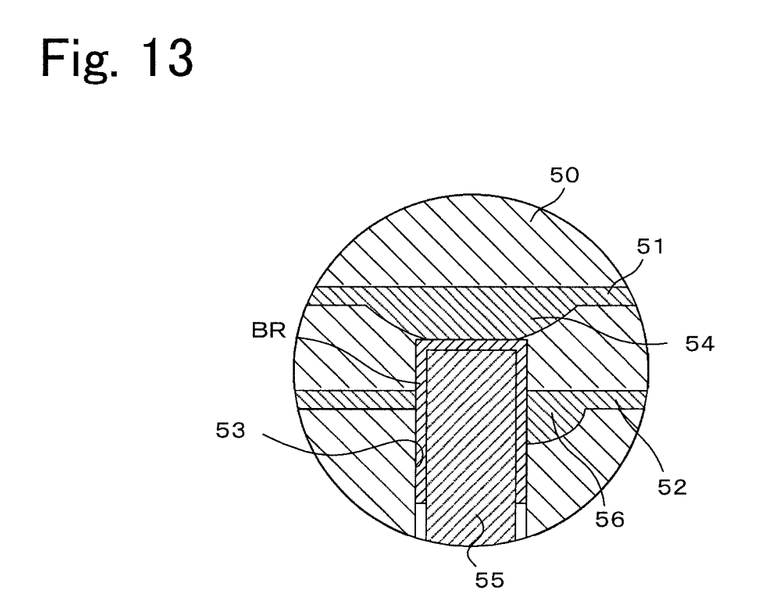
FIG. 13 is a partial vertical cross-sectional view of another embodiment.

Other embodiments illustrated in FIGS. 12 and 13 may be adopted instead of the above-described embodiment. In FIG. 12, a ceramic base 45 includes a plurality (here, two) of electrodes 46 embedded in layers at different heights. A terminal hole 47 penetrates the electrodes 46. A bonding terminal 48 is inserted into the terminal hole 47. An electrode lead-out portion 49 is formed around a through-hole in the electrode 46 to be thicker than the electrode 46, and an inner peripheral surface of the electrode lead-out portion 49 is bonded to a side surface of the bonding terminal 48 with a metallic brazing material layer BR interposed therebetween. In FIG. 13, a ceramic base 50 includes a plurality (here, two) of electrodes 51 and 52 embedded in layers at different heights. A terminal hole 53 penetrates the electrode 52 other than the uppermost electrode 51, and a lower surface of an electrode lead-out portion 54 of the electrode 51 is exposed at a bottom surface of the terminal hole 53. A bonding terminal 55 is inserted into the terminal hole 53. The electrode 52 includes an electrode lead-out portion 56. The electrode lead-out portion 56 is formed around a through-hole in the electrode 52 to be thicker than the electrode 52, and an inner peripheral surface of the electrode lead-out portion 56 is bonded to a side surface of the bonding terminal 55 with a metallic brazing material layer BR interposed therebetween. A top surface of the bonding terminal 55 is bonded to a lower surface of the electrode lead-out portion 54 of the electrode 51 with the metallic brazing material layer BR interposed therebetween.

The present application claims priority from Japanese Patent Application No. 2022-002885, filed on Jan. 12, 2022, the entire contents of which are incorporated herein by reference.

What is claimed is:

1. A wafer placement table comprising:
a ceramic base with an upper surface serving as a wafer placement surface;
an electrode embedded in the ceramic base;
a bonding terminal inserted into the ceramic base from a lower surface of the ceramic base and penetrating a through-hole formed in the electrode; and
an electrode lead-out portion formed in a peripheral edge of the through-hole to be thicker than the electrode and having an inner peripheral surface bonded to a side surface of the bonding terminal, and
wherein the bonding terminal is inserted into a terminal hole formed to penetrate the electrode from the lower surface of the ceramic base, and
the electrode-lead out portion is not provided in a position opposite a top surface of the bonding terminal, but is provided in a position opposite the side surface of the bonding terminal.

2. The wafer placement table according to claim 1, wherein the electrode lead-out portion is disposed as two or more electrode lead-out portions along the peripheral edge of the through-hole.

3. The wafer placement table according to claim 1, wherein
the electrode lead-out portion has a shape resulting from cutting out part of a conductive material in form of a spherical cap or a cylinder with a smaller diameter than the terminal hole when the terminal hole is formed.

4. The wafer placement table according to claim 3, wherein the bonding terminal is brazed to a side surface of the terminal hole, the side surface including an inner peripheral surface of the through-hole and an inner peripheral surface of the electrode lead-out portion, and to a bottom surface of the terminal hole with a metallic brazing material layer interposed therebetween, and
the metallic brazing material layer is disposed not to reach the lower surface of the ceramic base.

5. The wafer placement table according to claim 1, wherein the inner peripheral surface of the electrode lead-out portion is perpendicular to the wafer placement surface.

6. The wafer placement table according to claim 1, wherein a thickness of the electrode lead-out portion on a side close to the inner peripheral surface is 0.1 mm or more and 1 mm or less.

7. The wafer placement table according to claim 1, wherein the electrode lead-out portion has a downward convex shape relative to the electrode.

* * * * *